(12) United States Patent
Pan et al.

(10) Patent No.: US 12,266,633 B2
(45) Date of Patent: Apr. 1, 2025

(54) SEMICONDUCTOR STRUCTURE AND METHOD OF FORMING THE SAME

(71) Applicant: Taiwan Semiconductor Manufacturing Company, Ltd., Hsinchu (TW)

(72) Inventors: Chih-Chien Pan, Taipei (TW); Pu Wang, Hsinchu (TW); Li-Hui Cheng, New Taipei (TW); An-Jhih Su, Taoyuan (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/351,478

(22) Filed: Jul. 12, 2023

(65) Prior Publication Data

US 2023/0378130 A1    Nov. 23, 2023

Related U.S. Application Data

(63) Continuation of application No. 17/242,286, filed on Apr. 27, 2021, now Pat. No. 11,742,323.

(51) Int. Cl.
*H01L 25/065* (2023.01)
*H01L 23/00* (2006.01)
(Continued)

(52) U.S. Cl.
CPC ...... *H01L 25/0652* (2013.01); *H01L 23/3135* (2013.01); *H01L 23/49816* (2013.01); *H01L 24/27* (2013.01); *H01L 24/32* (2013.01); *H01L 24/33* (2013.01); *H01L 24/48* (2013.01); *H01L 2224/32145* (2013.01);
(Continued)

(58) Field of Classification Search
CPC . H10B 80/00; H01L 25/0652; H01L 25/0655; H01L 23/3135; H01L 23/49816; H01L 24/27; H01L 24/32; H01L 24/33; H01L 24/48; H01L 2224/33519;
(Continued)

(56) References Cited

U.S. PATENT DOCUMENTS 8,456,856 B2 * 6/2013 Lin .................. H01L 23/481
                                                361/783
8,993,380 B2   3/2015 Hou et al.
(Continued)

*Primary Examiner* — Jasmine J Clark
(74) *Attorney, Agent, or Firm* — JCIPRNET

(57) ABSTRACT

A semiconductor structure includes a first semiconductor package, a second semiconductor package, a heat spreader and an dielectric layer. The first semiconductor package includes a plurality of first semiconductor chips and a first dielectric encapsulation layer disposed around the plurality of the first semiconductor chips. The second semiconductor package is disposed over and corresponds to one of the plurality of first semiconductor chips, wherein the second semiconductor package includes a plurality of second semiconductor chips and a second dielectric encapsulation layer disposed around the plurality of second semiconductor chips. The heat spreader is disposed over and corresponds to another of the plurality of first semiconductor chips. The dielectric layer is disposed over the first semiconductor package and around the second semiconductor package and the heat spreader.

20 Claims, 17 Drawing Sheets

(51) Int. Cl.
  *H01L 23/31* (2006.01)
  *H01L 23/498* (2006.01)
(52) U.S. Cl.
  CPC ............... *H01L 2224/33517* (2013.01); *H01L 2224/33519* (2013.01); *H01L 2224/48225* (2013.01)
(58) Field of Classification Search
  CPC . H01L 2224/48225; H01L 2224/33517; H01L 2224/32145
  USPC .......................................................... 257/777
  See application file for complete search history.

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

* cited by examiner

SEMICONDUCTOR STRUCTURE AND METHOD OF FORMING THE SAME

CROSS-REFERENCE TO RELATED APPLICATION

This application is a continuation application of and claims the priority benefit of a prior application Ser. No. 17/242,286, filed on Apr. 27, 2021, now U.S. Pat. No. 11,742,323. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of semiconductor packages include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Currently, semiconductor packages are becoming increasingly popular for their compactness. However, the heat dissipation is a challenge in a variety of packages.

DETAILED DESCRIPTION

Figure 1A:
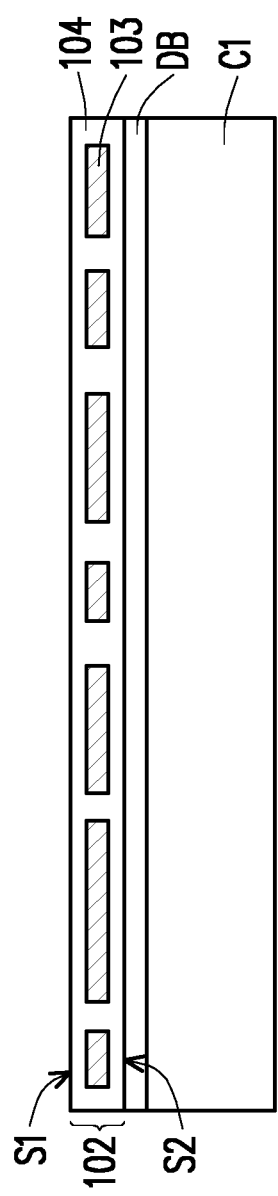
FIG. 1A to FIG. 1H are cross-sectional views of a method of forming a semiconductor structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1H are cross-sectional views of a method of forming a semiconductor structure in accordance with some embodiments.

Referring to FIG. 1A, a carrier C1 is provided with a redistribution layer structure 102 formed thereon. In some embodiments, a debonding layer DB is formed between the carrier C1 and the redistribution layer structure 102. In some embodiments, the carrier C1 is a non-semiconductor material, such as a glass carrier, a ceramic carrier, an organic carrier, or the like. In some embodiments, the debonding layer DB includes a Ultra-Violet (UV) glue, a Light-to-Heat Conversion (LTHC) glue, or the like, although other types of adhesives may be used. The debonding layer DB is decomposable under the heat of light to thereby release the carrier C1 from the structure formed thereon.

In some embodiments, the redistribution layer structure 102 is referred to as a "front-side redistribution layer structure" through the specification. In some embodiments, the redistribution layer structure 102 has a first side S1 and a second side S2 opposite to the first side S1. In some embodiments, the redistribution layer structure 102 includes a plurality of redistribution layers 103 embedded by a plurality of polymer layers 104. In some embodiments, each of the redistribution layers 103 includes Cu, W, Ni, Sn, Ti, Au, an alloy thereof, or a combination thereof, and is formed by photolithography, plating, and photoresist stripping processes. In some embodiments, each of the polymer layers 104 includes a polymer material such as polybenzoxazole (PBO), polyimide (PI), benzocyclobutene (BCB), the like, or a combination thereof, and is formed by a suitable fabrication technique such as spin-coating, lamination, deposition or the like.

Figure 1B:
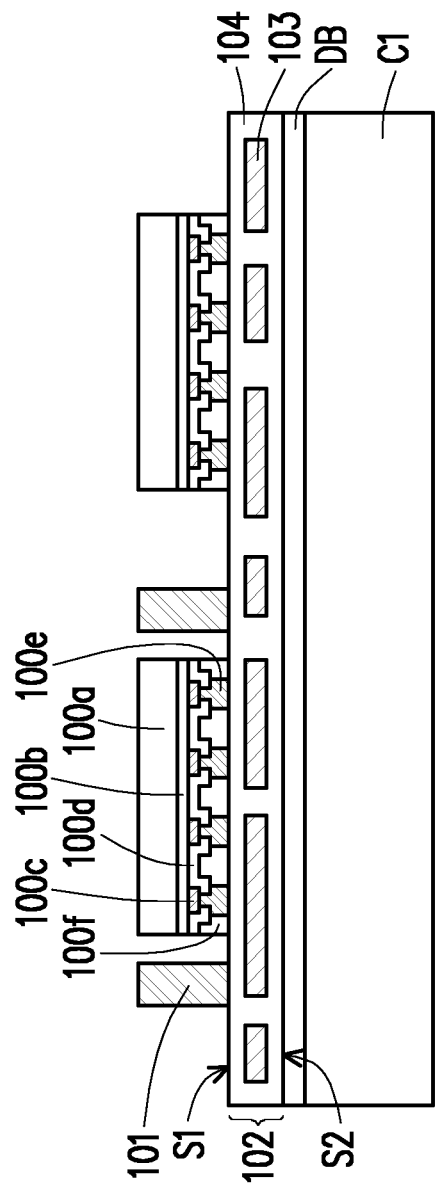

Referring to FIG. 1B, a plurality of through dielectric vias 101 are formed over the first side S1 of the redistribution layer structure 102. In some embodiments, the through dielectric vias 101 are electrically connected to the redistribution layer structure 102. In some embodiments, the through dielectric vias 101 include Cu, W, Ni, Sn, Ti, Au, an alloy thereof, or a combination thereof, and are formed by photolithography, plating, and photoresist stripping processes.

Thereafter, a plurality of semiconductor chip 100 are provided and bonded to the redistribution layer structure 102. In some embodiments, the semiconductor chip 100 are disposed side by side on the redistribution layer structure 102. In some embodiments, one of the semiconductor chips 100 is placed between the through dielectric vias 101, and another of the semiconductor chips 100 is placed outside of the through dielectric vias 101.

In some embodiments, the semiconductor chips 100 include a high power circuit. For example, each of the semiconductor chips 100 is a system-on-chip (SOC) die. The adjacent semiconductor chips 100 may have the same or different functions. Besides, the adjacent semiconductor chips 100 may have the same or different dimensions. The dimension includes a width, a length, a height or a top area. In some embodiments, two identical semiconductor chips 100 are provided and arranged laterally on the redistribution layer structure 102, but the present disclosure is not limited thereto. In other embodiments, two semiconductor chips 100 with different functions or different top areas are provided as needed. Upon the design requirements, one of the semiconductor chips 100 may be an active die while another of the semiconductor chips 100 may be a dummy die.

In some embodiments, each of the semiconductor chips 100 includes a semiconductor substrate 100a, an interconnection structure 100b disposed over the semiconductor substrate 100a, pads 100c disposed over and electrically connected to the interconnection structure 100b, a passivation layer 100d disposed over the interconnection structure 100b and exposing portions of the pads 100c, connectors 100e disposed over and electrically connected to the pads 100c, and a protection layer 100f disposed over the passivation layer 100d and around the connectors 100e.

The semiconductor substrate 100a may include silicon. The semiconductor substrate 100a may have a device layer that includes a gate and source/drain regions, and the interconnection structure 100b is electrically connected to the device layer. The pads 100c may be electrically connected to the interconnection structure 100b and may include aluminum. The passivation layer 100d includes a dielectric material such as silicon oxide, silicon nitride or silicon oxynitirde, a polymer material such as polybenzoxazole (PBO), polyimide (PI) or benzocyclobutene (BCB), or the like. The connectors 100e are formed through the passivation layer 100d and electrically connected to the pads 100c or the device layer. Throughout the description, the side of the semiconductor chip 100 with the connectors 100e is referred to as the front side. The connectors 100e may include Cu, W, Ni, Sn, Ti, Au, an alloy or a combination thereof, and are formed with an electroplating process and/or a ball drop process. The protection layer 100f includes a dielectric material such as silicon oxide, silicon nitride or silicon oxynitirde, a polymer material such as polybenzoxazole (PBO), polyimide (PI) or benzocyclobutene (BCB), or the like. The protection layer 100f is formed on the top surface of the semiconductor chip 100 filling the spaces between the connectors 100e. In some embodiments, the top surfaces of the connectors 100e can be level with the top surface of the protection layer 100f. The protection layer 100f may include a material different from that of the passivation layer 100d.

In some embodiments, the semiconductor chips 100 are flipped such that the front surfaces of the semiconductor chips 100 are facing downward (as shown in FIG. 1B) for subsequently bonding to the redistribution layer structure 102. In some embodiments, the semiconductor chips 100 are bonded to the redistribution layer structure 102 with the connectors 100e facing the redistribution layer structure 102.

Figure 1C:
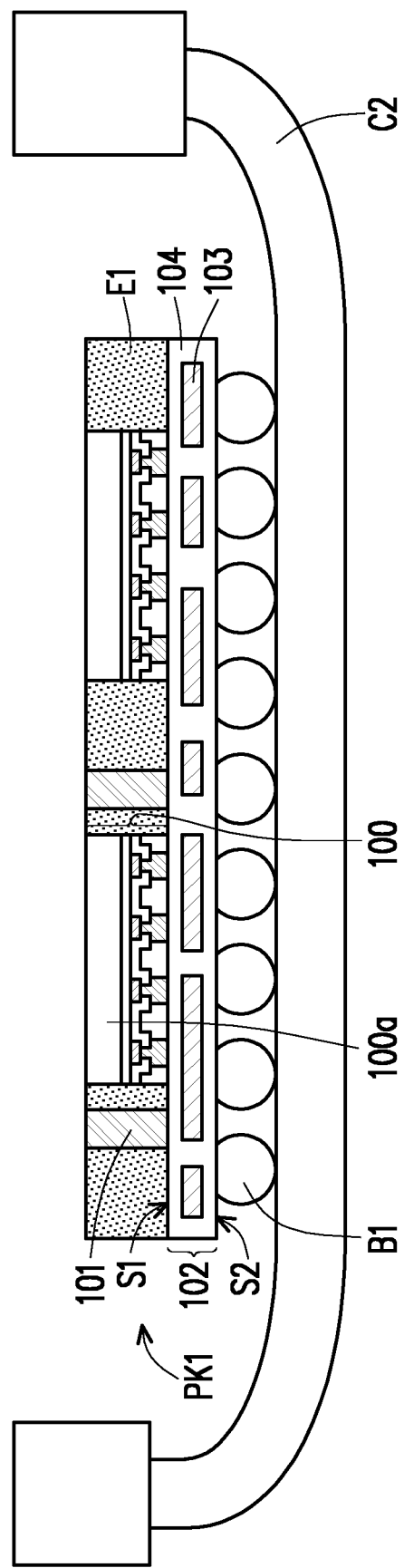

Referring to FIG. 1C, a dielectric encapsulation layer E1 is formed over the redistribution layer structure 102 to encapsulate or surround the sidewalls of the through dielectric vias 101 and the sidewalls of the semiconductor chips 100. In some embodiments, the dielectric encapsulation layer E1 includes a molding compound, a molding underfill, a resin or the like, such as epoxy. In some embodiments, the dielectric encapsulation layer E1 includes a polymer material such as polybenzoxazole (PBO), polyimide, benzocyclobutene (BCB), a combination thereof, or the like, and is formed by a molding process followed by a grinding process until surfaces of the through dielectric vias 101 and the back sides of the semiconductor chips 100 are exposed. In some embodiments, the top surface of the dielectric encapsulation layer E1 can be level with the exposed surfaces of the semiconductor chips 100.

Thereafter, the carrier C1 is debonded from the redistribution layer structure 102. In some embodiments, the debonding layer DB is decomposed under heat of light, and the carrier C1 is then released from the structure formed thereon.

Afterwards, external connectors or bumps B1 are placed over and bonded to the second side S2 of the redistribution layer structure 102. In some embodiments, the bumps B1 may be solder bumps, and/or may include metal pillars (e.g., copper pillars), solder caps formed on metal pillars, and/or the like. The bumps B1 may be formed by a suitable process such as evaporation, electroplating, ball drop, or screen printing. A semiconductor package PK1 is thus completed.

In some embodiments, the semiconductor package PK1 is then placed on a carrier C2. The carrier C2 may be a tape, a frame, a support substrate or the like. In some embodiments, the carrier C2 is attached to the bumps B1 of the semiconductor package PK1.

Figure 1D:
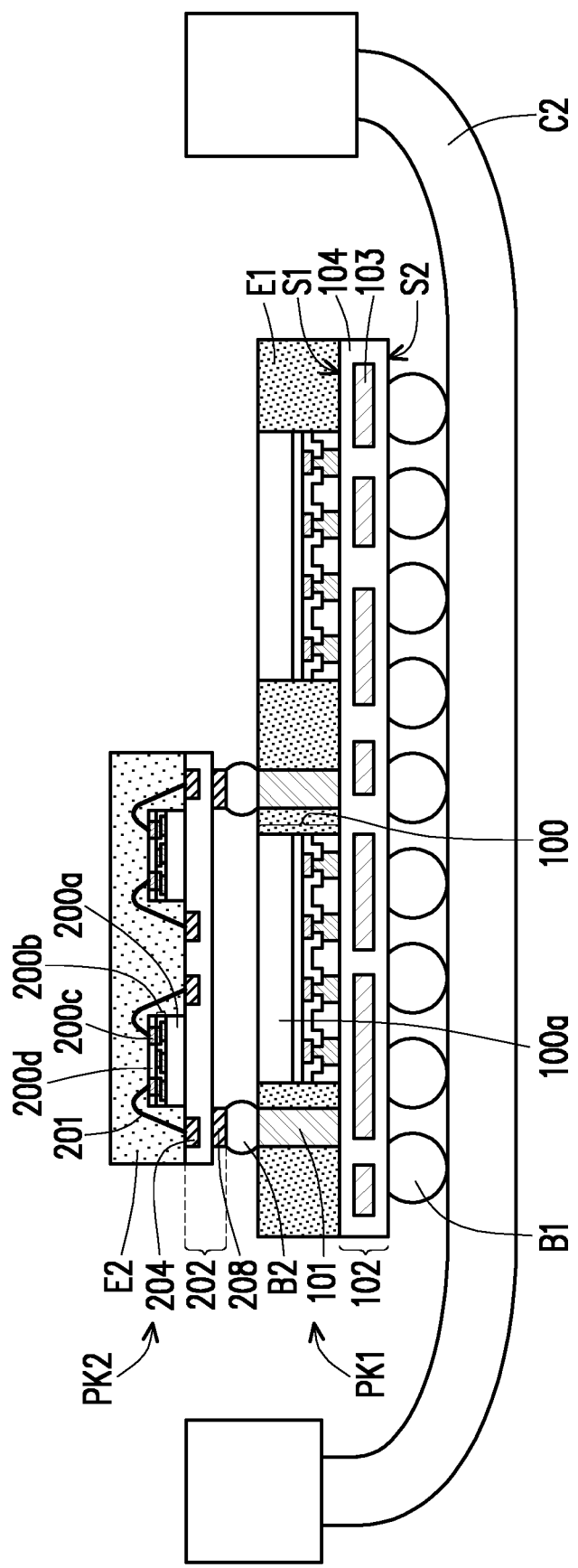

Referring to FIG. 1D, a semiconductor package PK2 is provided and bonded to the semiconductor package PK1. In some embodiments, the semiconductor package PK2 is bonded to the semiconductor package PK1 and corresponds to one of the semiconductor chips 100 (e.g., the left-side semiconductor chip 100 in FIG. 1D).

In some embodiments, the semiconductor package PK2 includes a plurality of semiconductor chips 200 arranged side by side. In some embodiments, the semiconductor chips 200 include a logic die, a central processing unit (CPU) die, a memory die, or the like. For example, each of the semiconductor chips 200 is a DRAM die. The adjacent semiconductor chips 200 may have the same or different functions. Besides, the adjacent semiconductor chips 200 may have the same or different dimensions. The dimension includes a width, a length, a height or a top area. In some embodiments, two identical semiconductor chips 200 are provided and arranged laterally, but the present disclosure is not limited thereto. In other embodiments, two semiconductor chips 200 with different functions or different top areas are provided as needed.

In some embodiments, each of the semiconductor chips 200 includes a semiconductor substrate 200a, an interconnection structure 200b disposed over the semiconductor substrate 200a, connectors 200c disposed over and electrically connected to the interconnection structure 200b, a passivation layer 200d disposed over the interconnection structure 200b and around the connectors 200c.

The semiconductor substrate 200a may include silicon. The semiconductor substrate 200a may have a device layer that includes a gate and source/drain regions, and the interconnection structure 200b is electrically connected to the device layer. Throughout the description, the side of the semiconductor chip 200 with the connectors 200c is referred to as the front side. The connectors 200c may include Cu, W, Ni, Sn, Ti, Au, an alloy or a combination thereof, and are formed with an electroplating process and/or a ball drop process. The passivation layer 200d includes a dielectric material such as silicon oxide, silicon nitride or silicon oxynitirde, a polymer material such as polybenzoxazole (PBO), polyimide (PI) or benzocyclobutene (BCB), or the like. In some embodiments, the top surfaces of the connectors 200c can be level with the top surface of the passivation layer 200d.

In some embodiments, the semiconductor package PK2 further includes an interposer substrate 202, and the semiconductor chips 200 are disposed laterally on the interposer substrate 202. The interposer substrate 202 is configured to electrically connect the semiconductor chips 200 to the underlying semiconductor chips 100. In some embodiments, the interposer substrate 202 is a silicon interposer, but the present disclosure is not limited thereto. In other embodiments, the interposer substrate 202 is an organic interposer. In some embodiments, the interposer substrate 202 includes conductive patterns therein or thereon. The conductive patterns of the interposer substrate 202 may include conductive wirings and conductive pads electrically connected to each other. In some embodiments, the conductive pads 204 of the interposer substrate 202 are electrically connected to the semiconductor chips 200 through wire bonds 201, although any suitable electrical bonding may be utilized. In some embodiments, the conductive pads 208 of the interposer substrate 202 are electrically connected to the through dielectric vias 101 through a plurality of external connectors or bumps B2 and therefore electrically connected to the redistribution layer structure 102 and the semiconductor chips 100. In some embodiments, the bumps B2 may be solder bumps, and/or may include metal pillars (e.g., copper pillars), solder caps formed on metal pillars, and/or the like. The bumps B2 may be formed by a suitable process such as evaporation, electroplating, ball drop, or screen printing.

A dielectric encapsulation layer E2 is further included in the semiconductor package PK2. In some embodiments, the dielectric encapsulation layer E2 is formed over the interposer substrate 202 to encapsulate or surround the sidewalls and tops of the semiconductor chips 200. In some embodiments, the dielectric encapsulation layer E2 includes a molding compound, a molding underfill, a resin or the like, such as epoxy. In some embodiments, the dielectric encapsulation layer E2 includes a polymer material such as polybenzoxazole (PBO), polyimide, benzocyclobutene (BCB), a combination thereof, or the like, and is formed by a molding process.

Figure 1E:
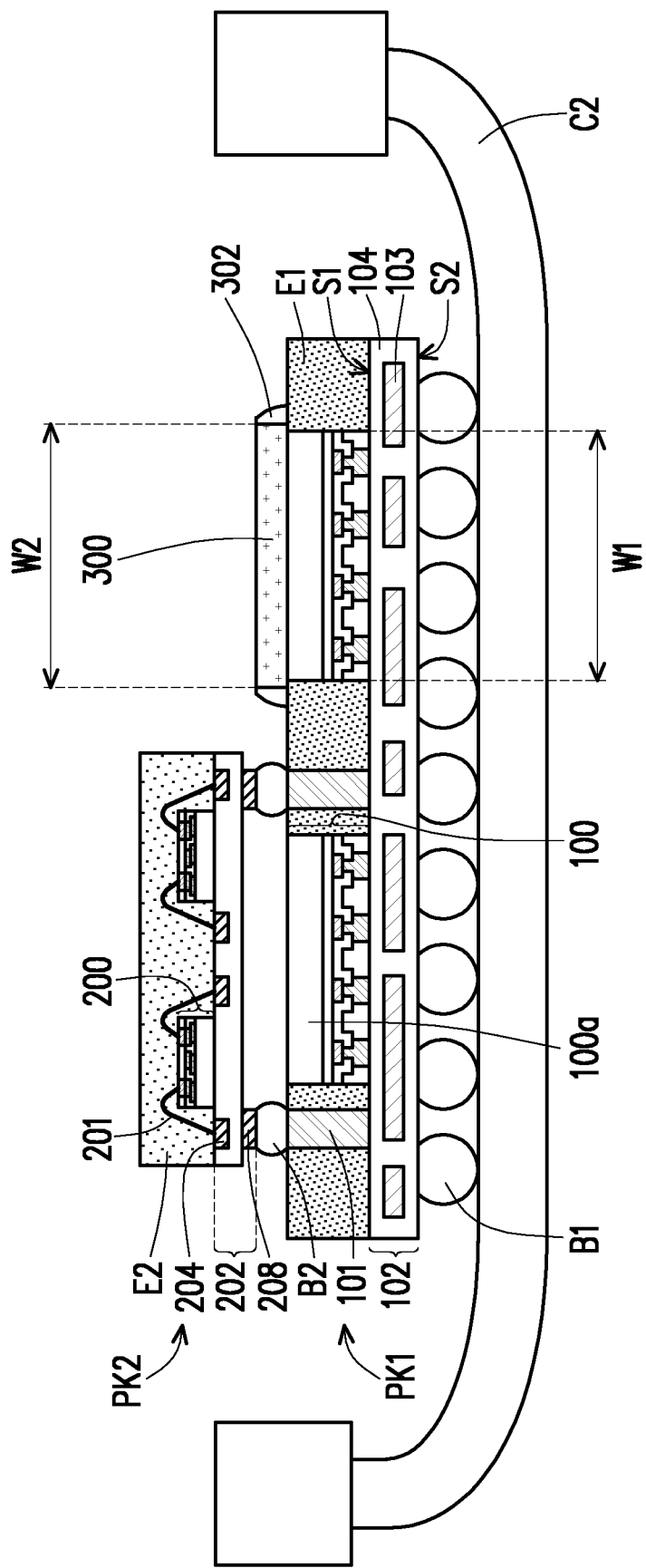

Referring to FIG. 1E, a thermal interface material (TIM) 300 is formed over the semiconductor package PK1 and corresponds to another of the semiconductor chips 100 (e.g., the right-side semiconductor chip 100 in FIG. 1E). In some embodiments, the thermal interface material 300 has a high thermal conductivity greater than about 30 W/m*K or about 50 W/m*K. In some embodiments, the thermal interface material 300 includes a polymer and a thermally conductive material. The polymer may include epoxy, glue, paste, or the like, and the thermally conductive material may include graphite, carbon nanotubes (CNT), a metal-based material (e.g., Sn, Ag, Al, Cu, Ni, Co, Ti or W) or the like. In some embodiments, the thermal interface material 300 may include a solder paste, an indium solder paste, a silver paste or the like. In some embodiments, the void rate of the thermal interface material 300 is about 2% or less. In some embodiments, the thermal interface material 300 is formed by a deposition process, a coating process, a lamination process, a stencil printing process, or the like.

In some embodiments, the width W2 of the thermal interface material 300 is greater than the width W1 of the underlying semiconductor chip 100, as shown in FIG. 1E. Specifically, the thermal interface material 300 is in contact with the semiconductor substrate 100a of the semiconductor chip 100 and the dielectric encapsulation layer E1. However, the present disclosure is not limited thereto. In other embodiments, the width W2 of the thermal interface material 300 may be substantially equal to or less than the width W1 of the underlying semiconductor chip 100.

Thereafter, an adhesive material 302 is formed on the sidewall of the thermal interface material 300. In some embodiments, the adhesive material 302 is configured to adhere a heat spreader to the thermal interface material 300, and may be omitted if the thermal interface material 300 is viscous enough to stick the heat spreader thereon. In some embodiments, the adhesive material 302 has an enclosed shape in a top view, but the present disclosure is not limited thereto. In other embodiments, the adhesive material 302 may be arranged around the corners of the thermal interface material 300. In some embodiments, the adhesive material 302 has a low thermal conductivity less than about 3 W/m*K or about 1 W/m*K. In some embodiments, the adhesive material 302 includes a molding compound, a molding underfill, a resin (e.g., epoxy, silicone or both), or the like. In some embodiments, the adhesive material 302 includes a polymer material, such as polybenzoxazole (PBO), polyimide (PI), benzocyclobutene (BCB), or the like. In some embodiments, the adhesive material 302 is formed by a deposition process, a coating process, a lamination process, a stencil printing process, or the like.

Figure 1F:
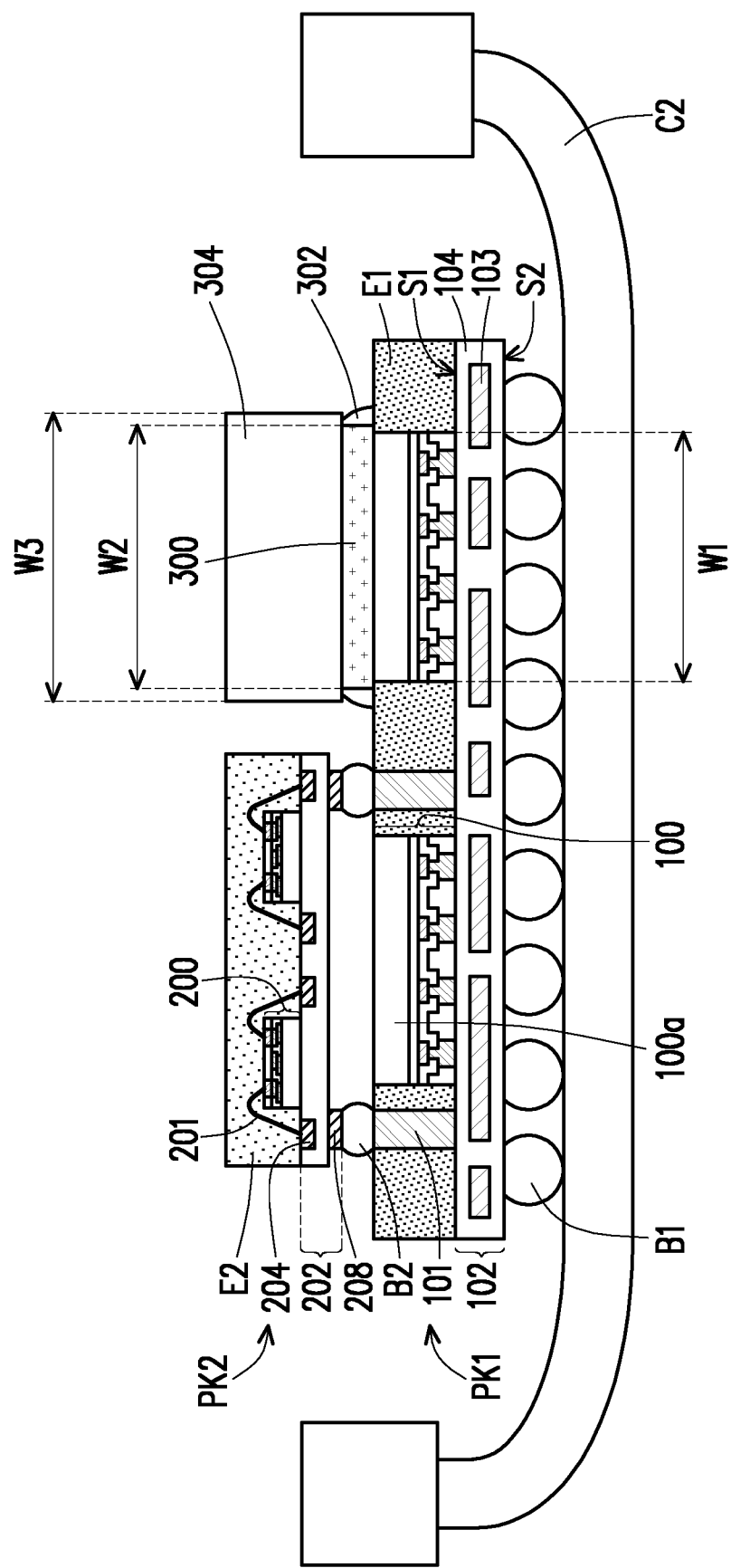

Referring to FIG. 1F, a heat spreader 304 is attached to the thermal interface material 300. In some embodiments, the heat spreader 304 may be formed from a material with high thermal conductivity, such as steel, stainless steel, copper, the like, or a combination thereof. The heat spreader 304 is referred to as a "lid", a "heat sink" or a "heat dissipation element" in some examples. In some embodiments, the heat spreader 304 is coated with another metal, such as gold, nickel, or the like. In some embodiments, the heat spreader 304 is a single bulk metal or a contiguous material. In some embodiments, the heat spreader 304 includes multiple pieces that may include the same or different materials. In some embodiments, the heat spreader 304 is a cold plate with a plurality of cold pipes therein. In some embodiments, the cold pipes may be arranged at an equal interval across the semiconductor package. In other embodiments, the cold pipes may be arranged near the hot spot of the semiconductor chip 100.

In some embodiments, the width W3 of the heat spreader 304 is greater than the width W2 of the underlying thermal interface material 300, as shown in FIG. 1F. Specifically, the heat spreader 304 is in contact with the thermal interface material 300 and the adhesive material 304. In some embodiments, the adhesive material 304 is in contact with the bottom surface of the heat spreader 304, as shown in FIG. 1F. However, the present disclosure is not limited thereto. In other embodiments, the adhesive material 304 further extends upwardly along the sidewall of the heat spreader 304, and covers the bottom corners of the heat spreader 304.

Figure 1G:
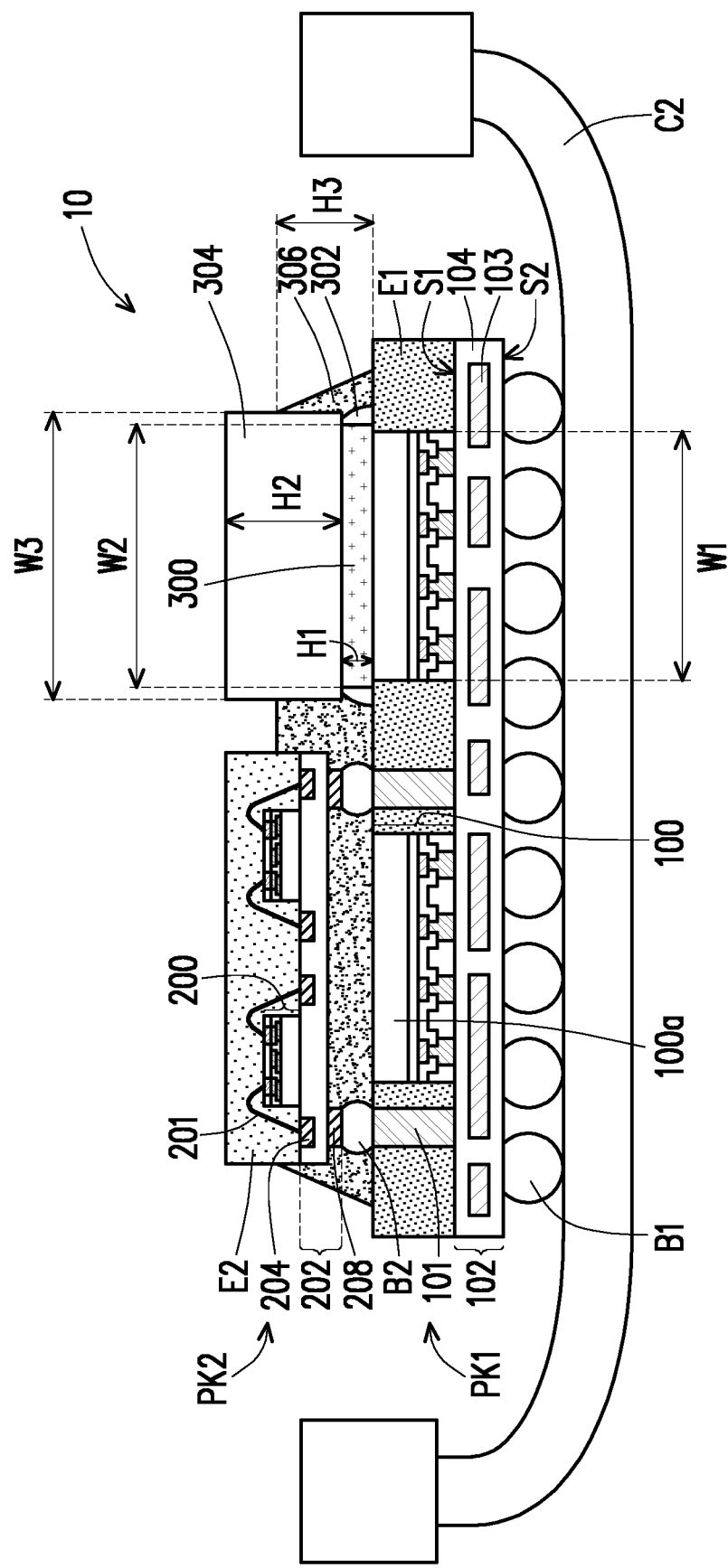

Referring to FIG. 1G, an underfill layer 306 is formed over the semiconductor package PK1 and around the semiconductor package PK2 and the heat spreader 304. Specifically, the underfill layer 306 fills the space between the semiconductor package PK2 and around the semiconductor package PK1 and surrounds the thermal interface material 300 and the heat spreader 304. In some embodiments, the thermal conductivity of the underfill layer 306 is about 3 W/mK or greater. For example, the thermal conductivity of the underfill layer 306 is about 3 to 5 W/mK or 3.5 to 4.5 W/mK. In some embodiments, the underfill layer 306 includes a molding compound, a molding underfill, a resin (e.g., epoxy, silicone or both), or the like. The underfill layer 306 further includes a filler to increase the thermal conductivity thereof. In some embodiments, the filler includes silica, alumina, boron nitride, magnesia, aluminum nitride, silicon nitride and the like, and the filler percentage is about 40 wt % to 90 wt %.

By increasing the thermal conductivity of the underfill layer 306, the heat of the underlying semiconductor chip 100 is released not only from the thermal interface material 300 and the heat spreader 304, but also from the underfill layer 306 around the thermal interface material 300 and the heat spreader 304.

In some embodiments, the height H3 of the underfill layer 306 is less than the sum of the height H1 of the thermal interface material 300 and the height H2 of the heat spreader 304, as shown in FIG. 1G. However, the present disclosure is not limited thereto. In other embodiments, the height H3 of the underfill layer 306 is substantially the same as the sum of the height H1 of the thermal interface material 300 and the height H2 of the heat spreader 304. Specifically, the amount of the underfill layer 306 may be adjusted as needed, as long as the underfill layer 306 does not overflow to the top surface of the heat spreader 304.

Figure 1H:
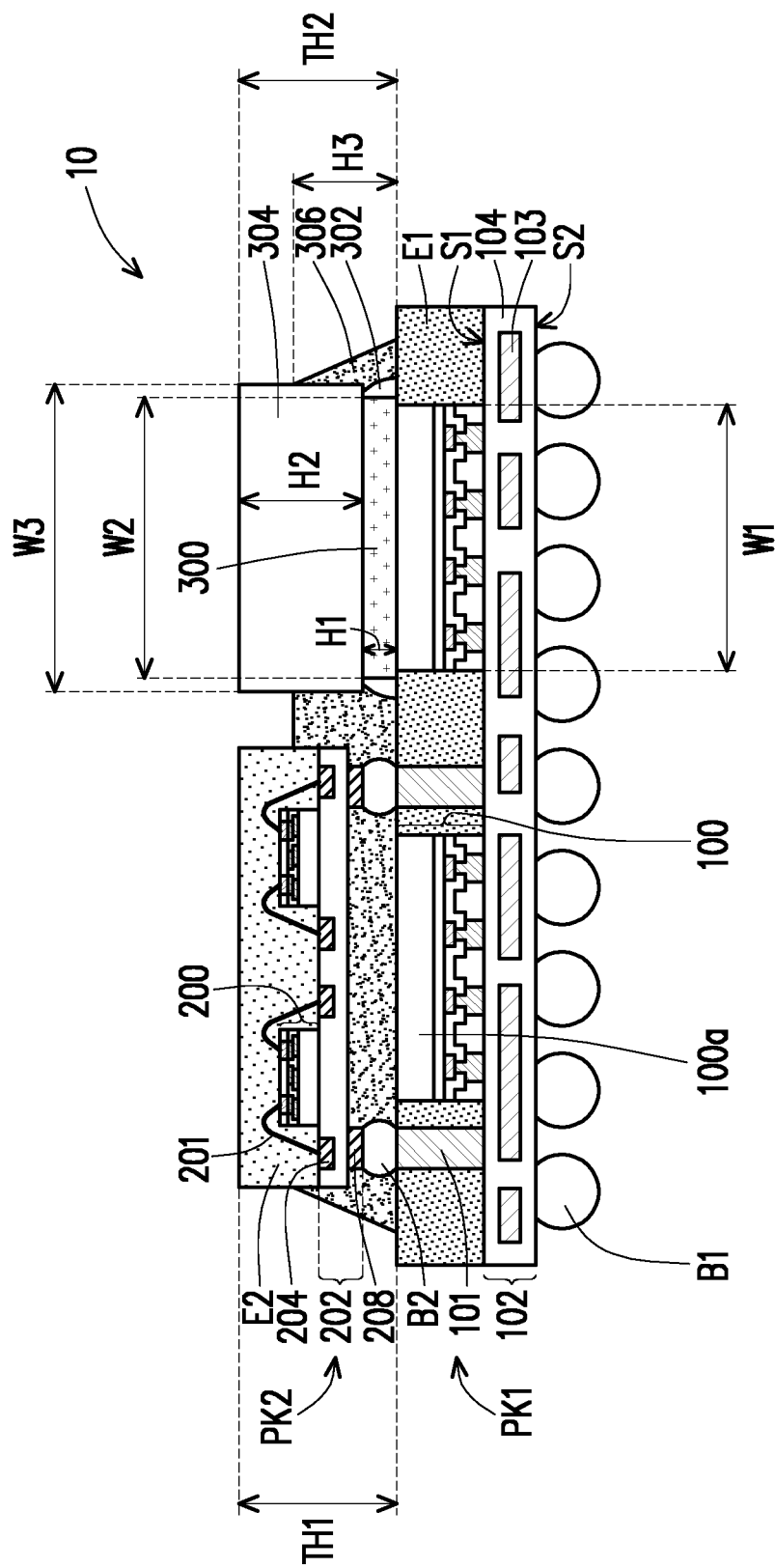

Referring to FIG. 1H, the carrier C2 is debonded from the lower semiconductor package PK1. The semiconductor structure 10 of the present disclosure is thus completed. In some embodiments, a cover member may be provided over the semiconductor package PK2 and the heat spreader 304 upon the process requirements. In some embodiments, a board substrate (e.g., PCB substrate) may be provided below and electrically connected to the semiconductor package PK1 upon the process requirements.

In the present disclosure, the thermal interface material 300 and the heat spreader 304 help to dissipate the heat of the package structure, and therefore improve the reliability and electrical performance of the package structure. In some embodiments, in the semiconductor structure 10, the total height TH1 of the semiconductor package PK2 is substantially the same as the total height TH2 of the sum of the height H1 of the thermal interface material 300 and the height H2 of the heat spreader 304. By such disposition, the thermal interface material 300 and the heat spreader 304 are beneficial to stiffen the package and protect the package against deformation or warpage. However, the disclosure is not limited thereto. In other embodiments, the total height TH1 of the semiconductor package PK2 may be different from the total height TH2 of the sum of the height H1 of the thermal interface material 300 and the height H2 of the heat spreader 304. The height difference between the total height TH1 and the total height TH2 is about 20%, about 10% or less.

Possible modifications and alterations can be made to the semiconductor structure. These modifications and alterations are provided for illustration purposes, and are not construed as limiting the present disclosure. FIG. 2 to FIG. 9 are cross-sectional views of semiconductor structures in accordance with alternative embodiments.

Figure 2:
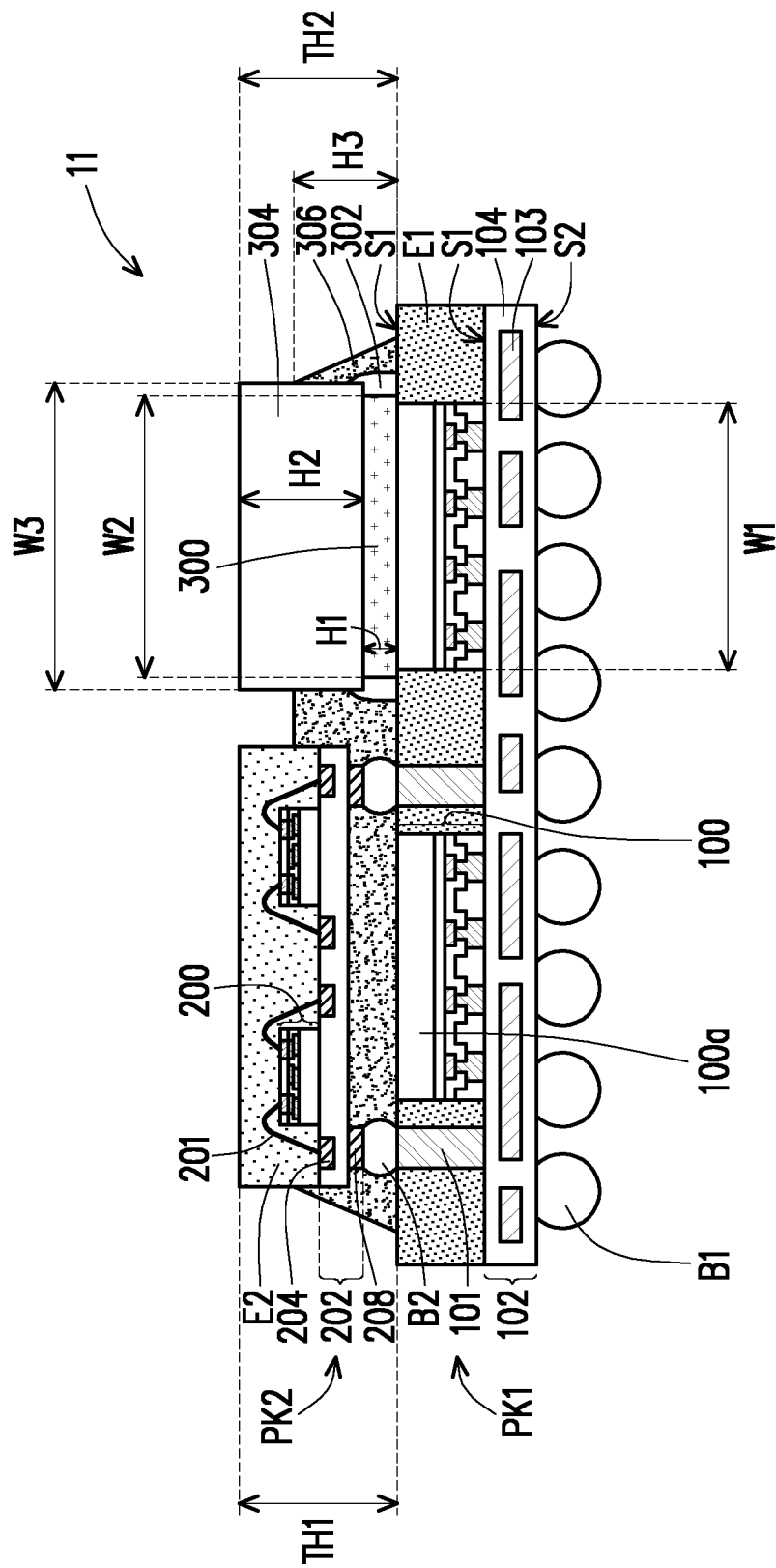
FIG. 2 to FIG. 9 are cross-sectional views of semiconductor structures in accordance with alternative embodiments.

The semiconductor structure 11 of FIG. 2 is similar to the semiconductor structure 10 of FIG. 1H, and the difference between them lies in that, the adhesive material 302 of the semiconductor structure 11 of FIG. 2 further extends along the sidewall of the heat spreader 304 and covers bottom corners of the heat spreader 304.

Figure 3:
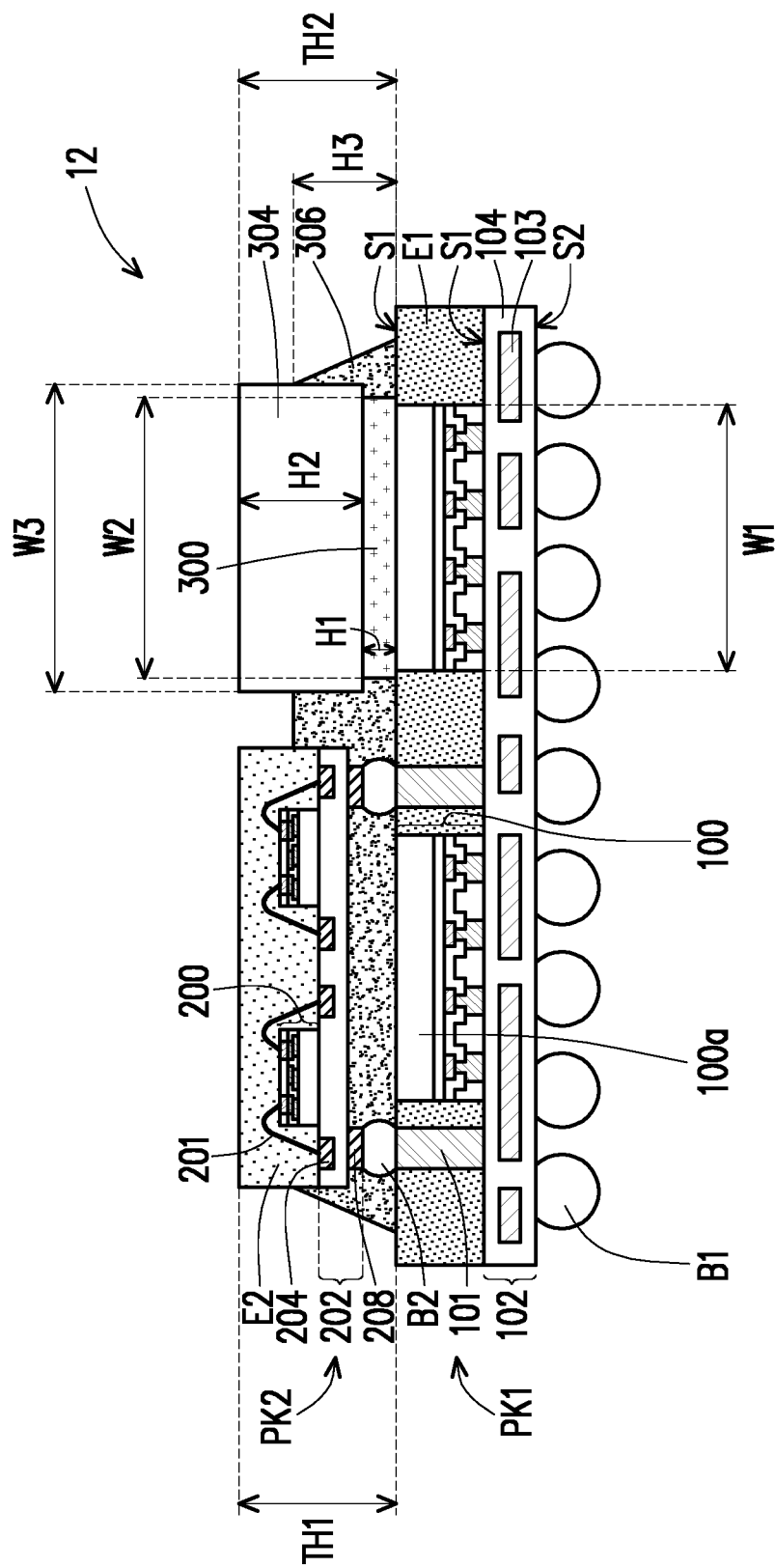

The semiconductor structure 12 of FIG. 3 is similar to the semiconductor structure 10 of FIG. 1H, and the difference between them lies in that, the semiconductor structure 12 of FIG. 3 is provided without an adhesive material 302.

Figure 4:
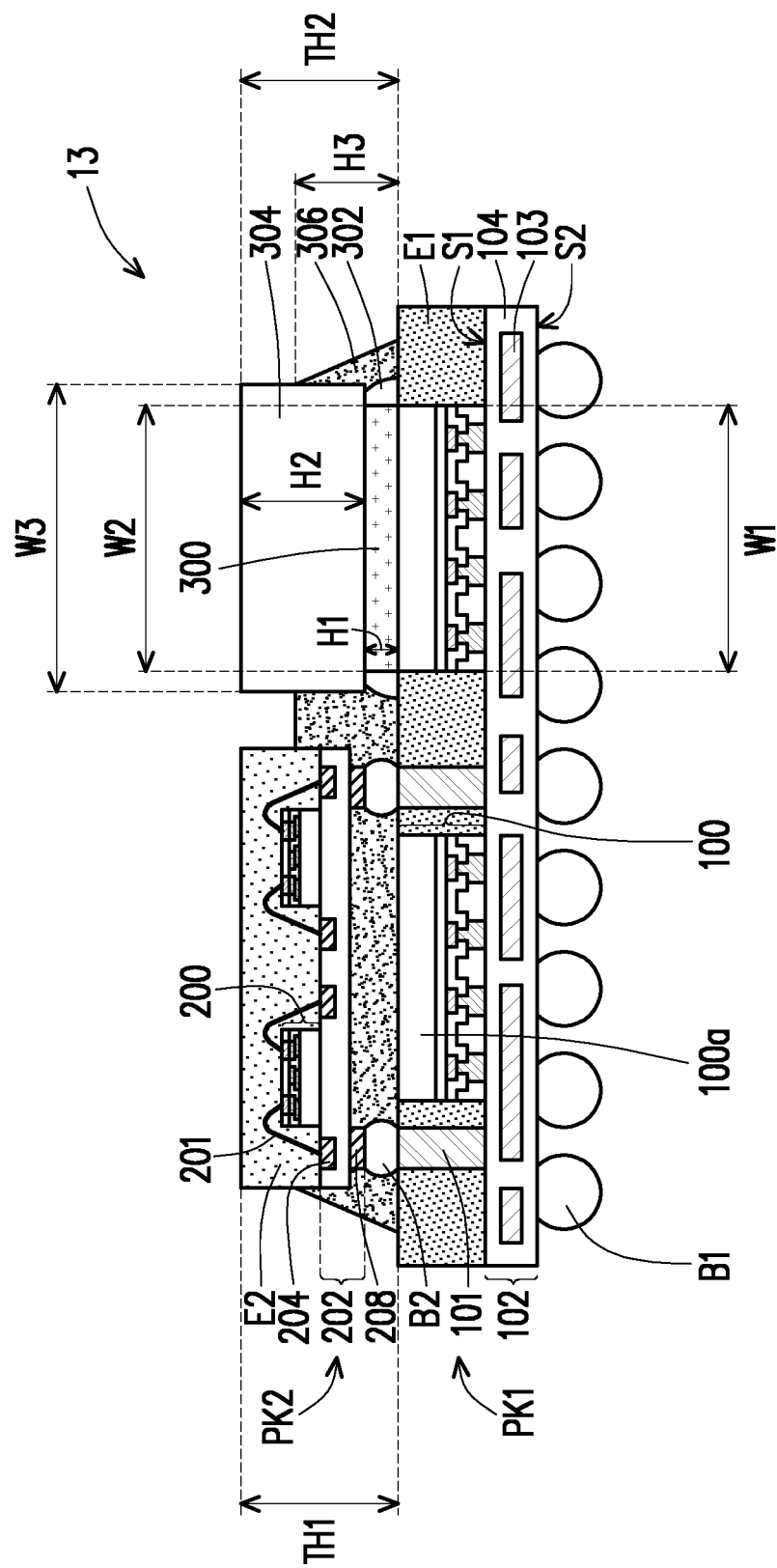
Figure 5:
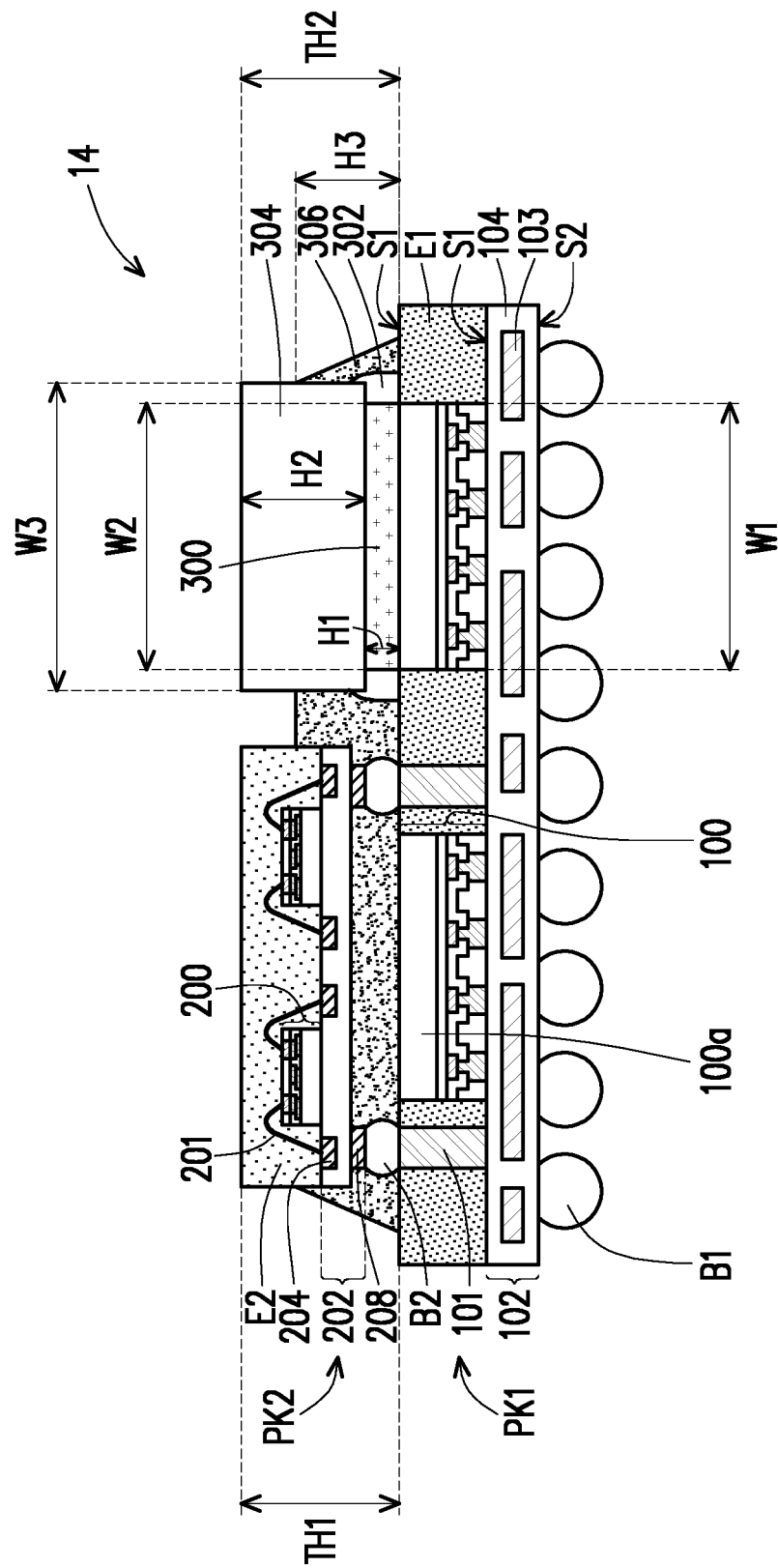
Figure 6:
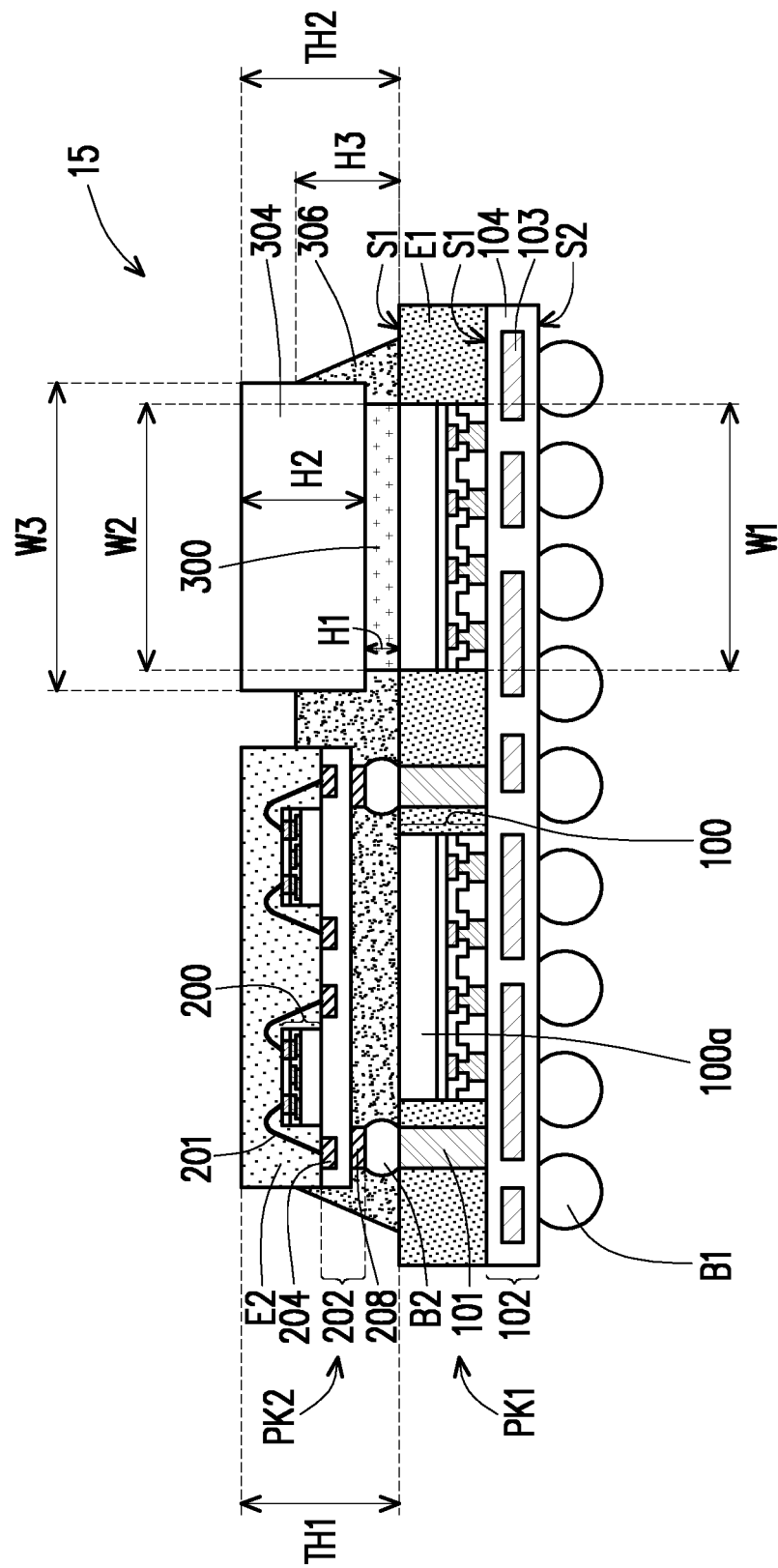

The semiconductor structures 13-15 of FIGS. 4-6 are similar to the semiconductor structures 10-12 of FIG. 1H and FIGS. 2-3, and the difference between them lies in that, in the semiconductor structures 13-15 of FIGS. 4-6, the width W2 of the thermal interface material 300 is substantially equal to the width W1 of the underlying semiconductor chip 100. Specifically, the edge of the thermal interface material 300 is substantially aligned with the edge of the underlying semiconductor chip 100.

Figure 7:
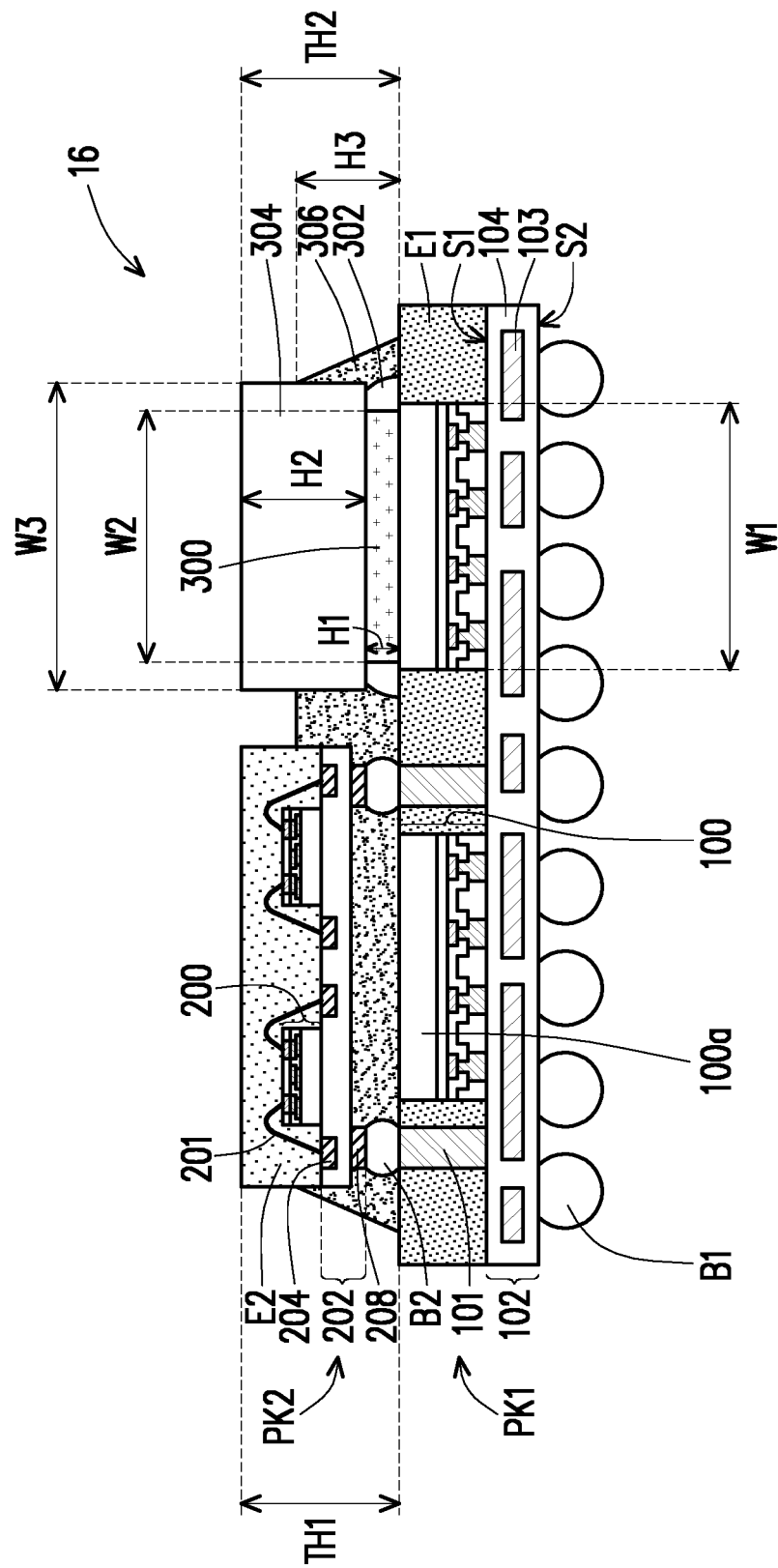
Figure 8:
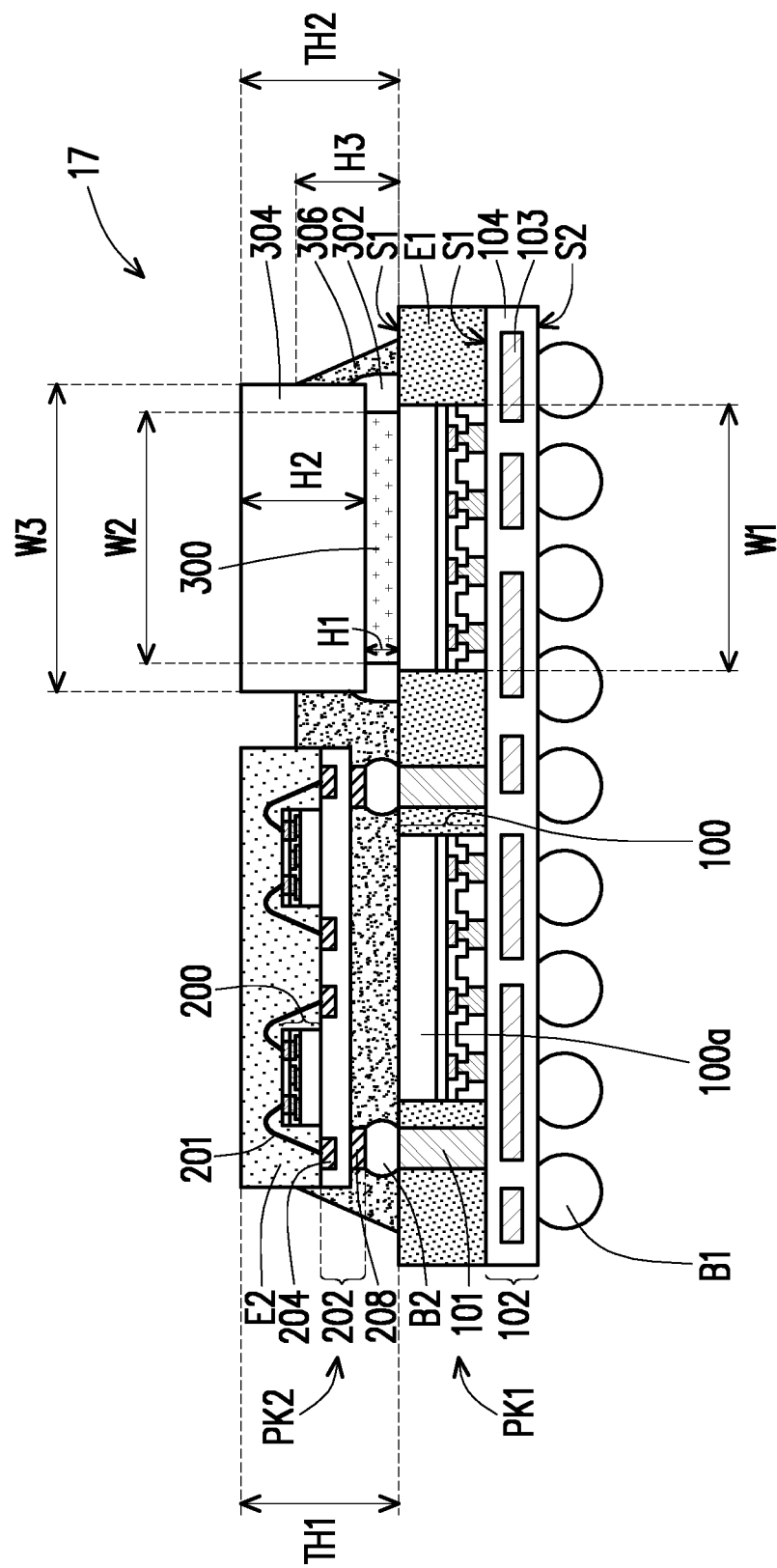
Figure 9:
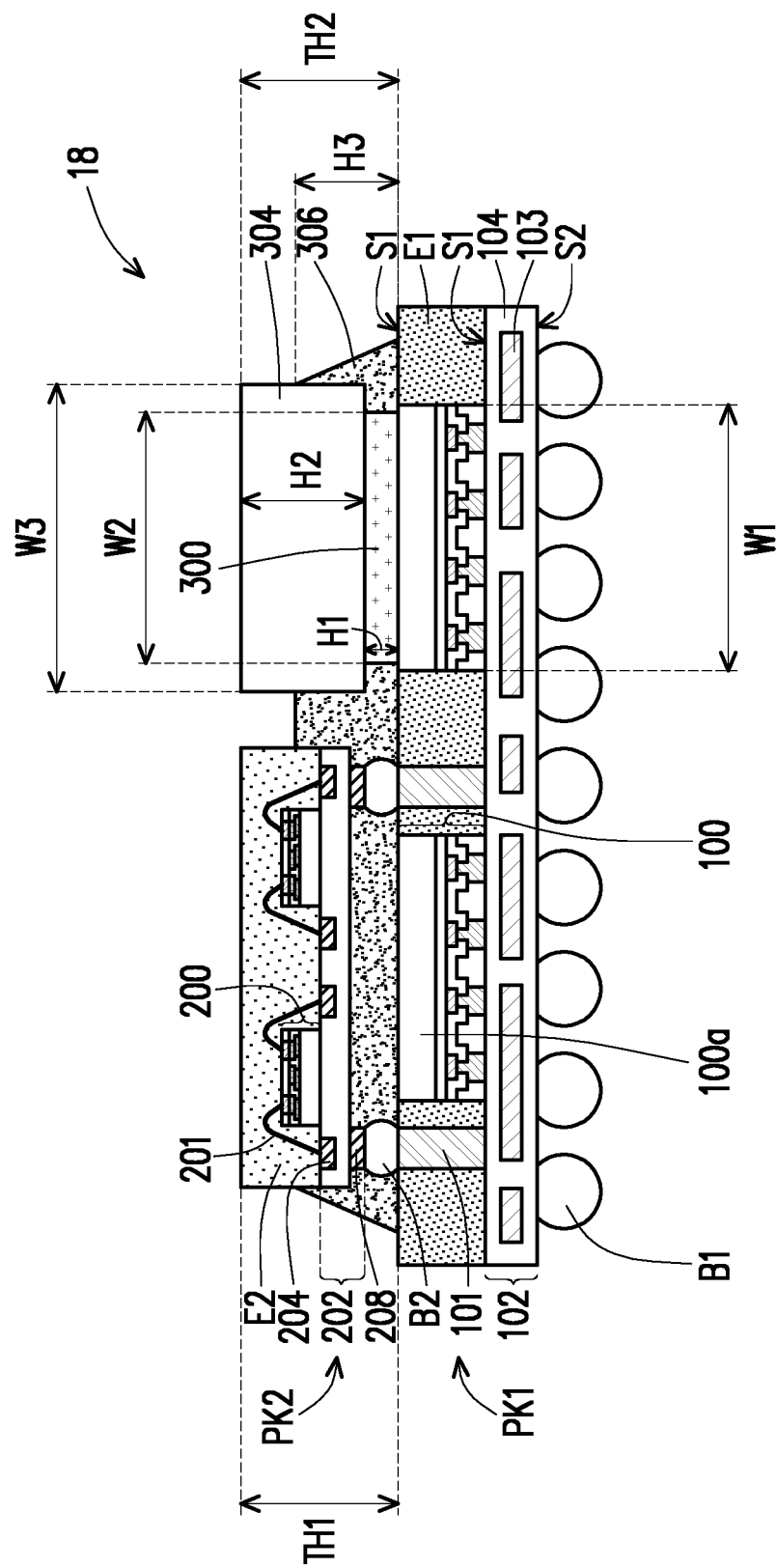

The semiconductor structures 16-18 of FIGS. 7-9 are similar to the semiconductor structures 10-12 of FIG. 1H and FIGS. 2-3, and the difference between them lies in that, in the semiconductor structures 16-18 of FIGS. 7-9, the width W2 of the thermal interface material 300 is less than the width W1 of the underlying semiconductor chip 100. By such disposition, the bottom surface of the adhesive material 302 is in contact with the semiconductor chip 100 and the dielectric encapsulation layer E1.

The semiconductor structures of the disclosure are illustrated below with reference to FIG. 1H and FIGS. 2-9.

In some embodiments, each of the semiconductor structures 10-18 includes a first semiconductor package PK1, a second semiconductor package PK2, a heat spreader 304 and an underfill layer 306. The first semiconductor package PK1 includes a plurality of lower semiconductor chips 100 and a first dielectric encapsulation layer E1 disposed around the plurality of the lower semiconductor chips 100. The second semiconductor package PK2 is disposed over and corresponds to one of the plurality of lower semiconductor chips 100, wherein the second semiconductor package PK2 includes a plurality of upper semiconductor chips 200 and a second dielectric encapsulation layer E2 disposed around the plurality of upper semiconductor chips 200. The heat spreader 304 is disposed over and corresponds to another of the plurality of lower semiconductor chips 100. The underfill layer 306 is disposed over the first semiconductor package PK1 and around the second semiconductor package PK2 and the heat spreader 304.

In some embodiments, each of the semiconductor structures 10-18 further includes a thermal interface material 300 between the heat spreader 304 and the corresponding lower semiconductor chip 100. In some embodiments, the width W2 of the thermal interface material 300 is different from the width W1 of the corresponding lower semiconductor chip 100, as shown in FIG. 1H, FIGS. 2-3 and FIGS. 7-9. In other embodiments, the width W2 of the thermal interface material 300 is substantially equal to the width W1 of the corresponding lower semiconductor chip 100, as shown in FIGS. 4-6. In some embodiments, the width W3 of the heat spreader 304 is greater than the width W2 of the thermal interface material 300.

In some embodiments, each of the semiconductor structures 10-11, 13-14 and 16-17 further includes an adhesive material 302 disposed between the heat spreader 304 and the corresponding lower semiconductor chip 100 and located aside a sidewall of the thermal interface material 300. In some embodiments, the adhesive material 302 further covers a bottom corner of the heat spreader 304. In some embodiments, the adhesive material 302 has an enclosed shape in a top view. In other embodiments, the adhesive material 302 has multiple segments separated from each other.

In some embodiments, the first semiconductor package PK1 further includes a redistribution layer structure 102 having a first side S1 and a second side S2 opposite to the first side S1, and the lower semiconductor chips 100 are electrically connected to the first side Si of the redistribution layer structure 102. In some embodiments, the first semiconductor package PK1 further includes a plurality of first bumps B1 electrically connected to the second side S2 of the redistribution layer structure 102.

In some embodiments, the first semiconductor package PK1 further includes a plurality of through dielectric vias 101 penetrating through the first dielectric encapsulation layer E1, and the second semiconductor package PK2 is electrically connected to the plurality of through dielectric vias 101 through a plurality of second bumps B2. In some embodiments, the dimension of the second bumps B2 is less than the dimension of the first bumps B1.

In some embodiments, each of the semiconductor structures 10-18 includes a first semiconductor package PK1, a second semiconductor package PK2, a thermal interface material 300 and a heat spreader 304. The first semiconductor package PK1 includes first and second semiconductor chips 100 arranged laterally. The second semiconductor package PK2 is disposed over the first semiconductor chip 100 (e.g., the left-side semiconductor chip 100). The thermal interface material 300 is disposed over and in contact with the second semiconductor chip 100 (e.g., the right-side semiconductor chip 100). The heat spreader 304 is disposed over the thermal interface material 300.

In some embodiments, each of the semiconductor structures 10-18 further includes an underfill layer 306 disposed over the first semiconductor package PK1 and around the second semiconductor package PK2 and the heat spreader 304, wherein the underfill layer 306 is in contact with a substrate surface of the first semiconductor chip 100 but separated from a substrate surface of the second semiconductor chip 100. In some embodiments, the underfill layer 306 has a thermal conductivity of about 3 W/mK or greater. In some embodiments, a void rate of the thermal interface material 300 is about 2% or less.

In some embodiments, the area (e.g., top-view area) of the thermal interface material 300 covers at least 70% of the area (e.g., top-view area) of the second semiconductor chip 100. In some embodiments, the ratio of the area of the thermal interface material 300 to the total backside area (or chip area) of the semiconductor chip 100 is more than about 0.70. In some embodiments, the area ratio of the thermal interface material 300 to the semiconductor chip 100 can be, for example but not limited to, about 0.70, 0.75, 0.80, 0.85, 0.90, 0.95, 1.00, including any range between any two of the preceding values and any range more than any one of the preceding values. In some embodiments, the area ratio of the thermal interface material 300 to the semiconductor chip 100 is such as to improve the heat dissipation efficiency.

In some embodiments, the height H1 of the thermal interface material 300 is equal to or less than a distance between the second semiconductor package PK2 and the first semiconductor package PK1. In some embodiments, the height H1 of the thermal interface material 300 ranges from about 20 um to 150 um, such as from about 50 um to 100 um.

In some embodiments, each of the semiconductor structures 10-11, 13-14 and 16-17 further includes an adhesive material 302 covering a sidewall of the thermal interface material 300. In some embodiments, the adhesive material 302 further covers a lower sidewall of the heat spreader 304.

In some embodiments, the second semiconductor package PK2 includes at least one upper die 200 and an interposer substrate 202 disposed between the at least one upper die 200 and the first semiconductor package PK1.

Figure 10:
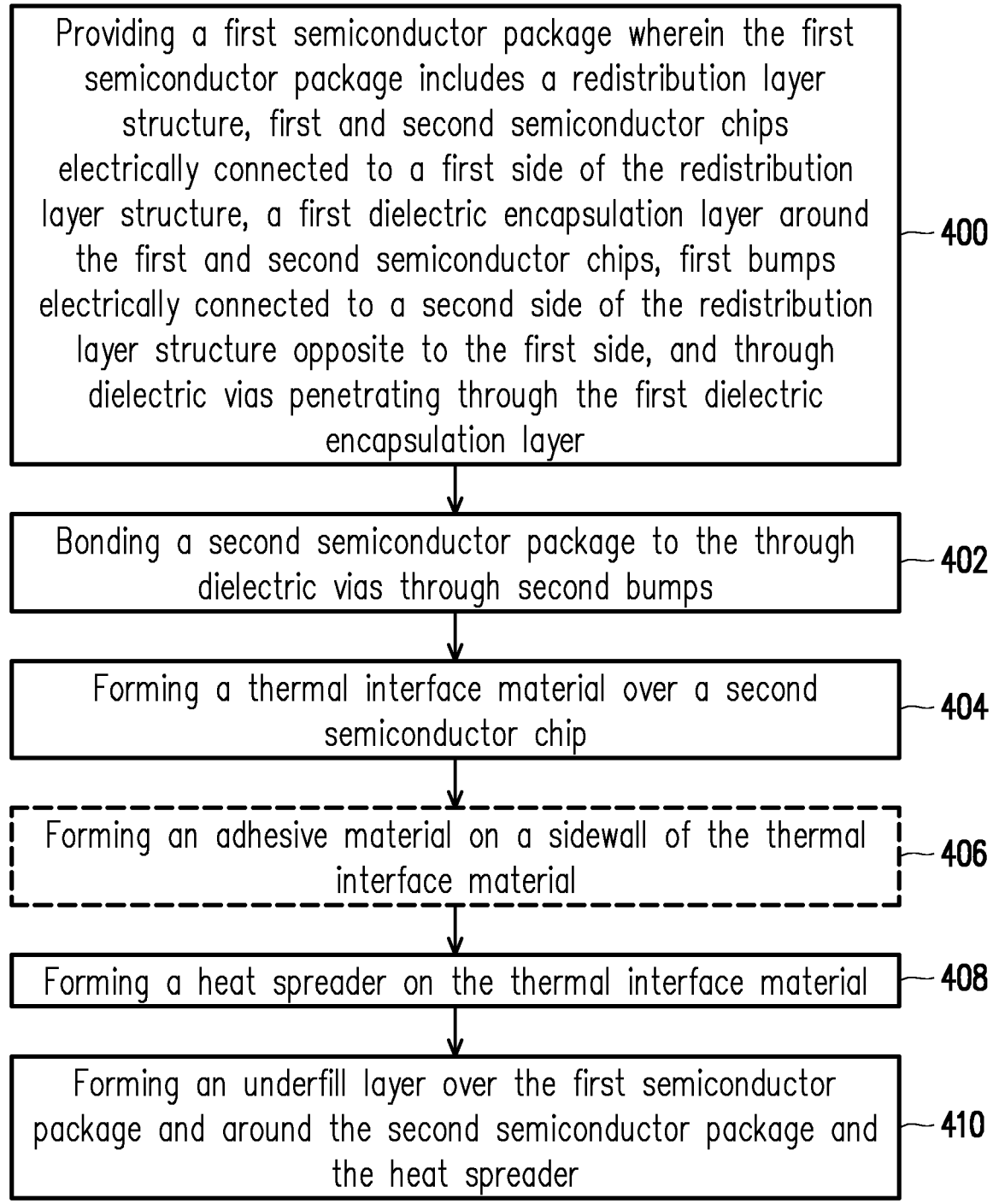
FIG. 10 is a flow chart of forming a semiconductor structure in accordance with some embodiments.

FIG. 10 is a flow chart of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 400, a first semiconductor package is provided, wherein the first semiconductor package includes a redistribution layer structure, first and second semiconductor chips electrically connected to a first side of the redistribution layer structure, a first dielectric encapsulation layer around the first and second semiconductor chips, first bumps electrically connected to a second side of the redistribution layer structure opposite to the first side, and through dielectric vias penetrating through the first dielectric encapsulation layer. FIG. 1A to FIG. 1C illustrate cross-sectional views corresponding to some embodiments of act 400. FIG. 2 to FIG. 9 illustrate cross-sectional views corresponding to some embodiments of act 400.

At act 402, a second semiconductor package is bonded to the through dielectric vias through second bumps. FIG. 1D illustrates a cross-sectional view corresponding to some embodiments of act 402. FIG. 2 to FIG. 9 illustrate cross-sectional views corresponding to some embodiments of act 402. In some embodiments, the second semiconductor package includes multiple dies laterally or vertically stacked. In other embodiments, the second semiconductor package includes a single die.

At act 404, a thermal interface material is formed over a second semiconductor chip. FIG. 1E illustrates a cross-sectional view corresponding to some embodiments of act 404. FIG. 2 to FIG. 9 illustrate cross-sectional views corresponding to some embodiments of act 404. In some embodiments, the thermal interface material is a single-layer. In other embodiments, the thermal interface material includes a lower thermal interface material and an upper thermal interface material over the lower thermal interface material, the upper thermal interface material is more viscous than the lower thermal interface material, and the upper thermal interface material is in contact with the overlying heat spreader.

At act 406, an adhesive material is formed on a sidewall of the thermal interface material. FIG. 1E illustrates a cross-sectional view corresponding to some embodiments of act 406. FIG. 2, FIGS. 4-5 and FIGS. 7-8 illustrate cross-sectional views corresponding to some embodiments of act 406. Act 406 may be optionally omitted as needed, as shown in FIG. 3, FIG. 6 and FIG. 9.

At act 408, a heat spreader is formed on the thermal interface material. FIG. 1F illustrates a cross-sectional view corresponding to some embodiments of act 408. FIG. 2 to FIG. 9 illustrate cross-sectional views corresponding to some embodiments of act 408.

At act 410, an underfill layer is formed over the first semiconductor package and around the second semiconductor package and the heat spreader. FIG. 1F illustrates a cross-sectional view corresponding to some embodiments of act 410. FIG. 2 to FIG. 9 illustrate cross-sectional views corresponding to some embodiments of act 410.

In view of the above, in some embodiments of the disclosure, by disposing a thermal interface material and a heat spreader (e.g., lid) over a high-power chip of a semiconductor package, the heat dissipation efficiency of the semiconductor package is greatly increased. By adopting the heat dissipation schemes of the disclosure, not only the operation temperature of the package is reduced, the hot spot of the high-power chip is also eliminated. In some embodiments, an adhesive material is disposed around the thermal interface material and between the lid and the high-power chip. With such arrangement, no delamination is observed at the interfaces between the lid and the TIM, between the TIM and the molding, and between the TIM and the high-power chip. Good transmission scanning acoustic microscopy (TSAM) coverage (>98%) is achieved by lid attachment on TIM with adhesive material dispensing. Therefore, the reliability and electrical performance of the package structure are accordingly improved.

In accordance with some embodiments of the present disclosure, a semiconductor structure includes a first semiconductor package, a second semiconductor package, a heat spreader and an underfill layer. The first semiconductor package includes a plurality of lower semiconductor chips and a first dielectric encapsulation layer disposed around the plurality of the lower semiconductor chips. The second semiconductor package is disposed over and corresponds to one of the plurality of lower semiconductor chips, wherein the second semiconductor package includes a plurality of upper semiconductor chips and a second dielectric encapsulation layer disposed around the plurality of upper semiconductor chips. The heat spreader is disposed over and corresponds to another of the plurality of lower semiconductor chips. The underfill layer is disposed over the first semiconductor package and around the second semiconductor package and the heat spreader.

In accordance with alternative embodiments of the present disclosure, a semiconductor structure includes a first semiconductor package, a second semiconductor package, a thermal interface material and a heat spreader. The first semiconductor package includes first and second semiconductor chips arranged laterally. The second semiconductor package is disposed over the first semiconductor chip. The thermal interface material is disposed over and in contact with the second semiconductor chip. The heat spreader is disposed over the thermal interface material.

In accordance with yet alternative embodiments of the present disclosure, a method of forming a semiconductor structure includes at least the following operations. A first semiconductor package is provided over a carrier, wherein the first semiconductor package includes a redistribution layer structure, first and second semiconductor chips electrically connected to a first side of the redistribution layer structure, a first dielectric encapsulation layer around the first and second semiconductor chips, first bumps electrically connected to a second side of the redistribution layer structure opposite to the first side, and through dielectric vias penetrating through the first dielectric encapsulation layer. A second semiconductor package is bonded to the through dielectric vias through second bumps. A thermal interface material is formed over a second semiconductor chip. A heat spreader is formed on the thermal interface material. An underfill layer is formed over the first semiconductor package and around the second semiconductor package and the heat spreader.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a first semiconductor package comprising a plurality of dies laterally disposed side by side;
 a second semiconductor package disposed over and corresponding to a first one of the plurality of dies;
 a heat spreader disposed over and corresponding to a second one of the plurality of dies; and
 a dielectric layer disposed over the first semiconductor package and around the second semiconductor package and the heat spreader.

2. The semiconductor structure of claim 1, further comprising a thermal interface material between the heat spreader and the corresponding die.

3. The semiconductor structure of claim 2, wherein a width of the heat spreader is greater than a width of the thermal interface material.

4. The semiconductor structure of claim 2, further comprising an adhesive material disposed between the heat spreader and the corresponding die and located beside a sidewall of the thermal interface material.

5. The semiconductor structure of claim 4, wherein the adhesive material has an enclosed shape in a top view.

6. The semiconductor structure of claim 4, wherein the adhesive material further covers a bottom corner of the heat spreader.

7. The semiconductor structure of claim 1, wherein the first semiconductor package further comprises a redistribution layer structure having a first side and a second side opposite to the first side, and the dies are electrically connected to the first side of the redistribution layer structure.

8. The semiconductor structure of claim 7, wherein the first semiconductor package further comprises a plurality of first bumps electrically connected to the second side of the redistribution layer structure.

9. The semiconductor structure of claim 1, wherein the first semiconductor package further comprises a plurality of through dielectric vias around the dies, and the second semiconductor package is electrically connected to the plurality of through dielectric vias through a plurality of second bumps.

10. A semiconductor structure, comprising:
 a first semiconductor package comprising a first semiconductor chip and a second semiconductor chip arranged laterally;
 a second semiconductor package disposed over the first semiconductor chip;
 a heat spreader disposed over the second semiconductor chip; and
 a glue layer disposed between and in contact with the heat spreader and the second semiconductor chip.

11. The semiconductor structure of claim 10, further comprising a dielectric layer disposed over the first semiconductor package and around the second semiconductor package and the heat spreader, wherein the dielectric layer is in contact with a substrate surface of the first semiconductor chip but separated from a substrate surface of the second semiconductor chip.

12. The semiconductor structure of claim 10, wherein the dielectric layer has a thermal conductivity of about 3 W/mK or greater.

13. The semiconductor structure of claim 10, wherein a void rate of the glue layer is about 2% or less.

14. The semiconductor structure of claim 10, wherein an area of the glue layer covers at least 70% of an area of the second semiconductor chip.

15. The semiconductor structure of claim 10, wherein a height of the glue layer is equal to or less than a distance between the second semiconductor package and the first semiconductor package.

16. The semiconductor structure of claim 10, wherein the glue layer comprises a thermal interface material.

17. The semiconductor structure of claim 16, wherein the glue layer further comprises an adhesive material surrounding the thermal interface material.

18. The semiconductor structure of claim 10, wherein the second semiconductor package comprises at least one upper die and an interposer substrate disposed between the at least one upper die and the first semiconductor package.

19. A method of forming a semiconductor structure, comprising:
   forming a first semiconductor package comprising a first semiconductor chip and a second semiconductor chip arranged laterally;
   forming a second semiconductor package over the first semiconductor chip;
   forming a heat spreader over the second semiconductor chip; and
   forming a glue layer between and in contact with the heat spreader and the second semiconductor chip.

20. The method of claim 19, further comprising forming a dielectric layer over the first semiconductor package and around the second semiconductor package and the heat spreader, wherein the dielectric layer is in contact with a substrate surface of the first semiconductor chip but separated from a substrate surface of the second semiconductor chip.

* * * * *